United States Patent
Saenger et al.

(10) Patent No.: US 9,140,994 B2
(45) Date of Patent: Sep. 22, 2015

(54) METHOD FOR ADJUSTING AN OPTICAL SYSTEM OF A MICROLITHOGRAPHIC PROJECTION EXPOSURE APPARATUS

(71) Applicant: Carl Zeiss SMT GmbH, Oberkochen (DE)

(72) Inventors: Ingo Saenger, Heidenheim (DE); Bastian Trauter, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 14/458,423

(22) Filed: Aug. 13, 2014

(65) Prior Publication Data

US 2014/0362362 A1    Dec. 11, 2014

Related U.S. Application Data

(63) Continuation of application No. PCT/EP2013/054167, filed on Mar. 1, 2013.

(60) Provisional application No. 61/610,545, filed on Mar. 14, 2012.

(30) Foreign Application Priority Data

Mar. 14, 2012   (DE) .......................... 10 2012 203 944

(51) Int. Cl.
*G03B 27/72*    (2006.01)
*G03B 27/54*    (2006.01)
(Continued)

(52) U.S. Cl.
CPC ........ *G03F 7/70191* (2013.01); *G02B 26/0833* (2013.01); *G02B 27/286* (2013.01); *G03F 7/70116* (2013.01); *G03F 7/70141* (2013.01); *G03F 7/70566* (2013.01)

(58) Field of Classification Search
CPC ............................ G03F 7/7014; G03F 7/70566
USPC ................. 355/52, 53, 55, 67, 71; 359/258
See application file for complete search history.

(56) References Cited

U.S. PATENT DOCUMENTS 7,375,799 B2 *  5/2008  Van De Kerkhof et al. .... 355/71
7,924,436 B2    4/2011  Mengel et al.
(Continued)

FOREIGN PATENT DOCUMENTS

DE    10 2007 038 056 A1    2/2009
DE    10 2007 055 062 A1    5/2009
DE    10 2009 021 096 A1    2/2010

OTHER PUBLICATIONS

German Office Action, with English translation thereof, for DE Appl No. 10 2012 203 944.9 dated Nov. 5, 2012.
(Continued)

*Primary Examiner* — Hung Henry Nguyen
(74) *Attorney, Agent, or Firm* — Fish & Richardson P.C.

(57) ABSTRACT

A method for adjusting an optical system in a microlithographic projection exposure apparatus includes establishing, for a given actual position of a polarization-influencing component, a distribution of IPS values in a pupil plane of the projection exposure apparatus. Each IPS value denotes the degree of realization of a predetermined polarization state for a light ray reflected at a respective mirror element of the mirror arrangement. The method also includes changing the position of the polarization-influencing component on the basis of the established distribution.

21 Claims, 8 Drawing Sheets

(51) Int. Cl.
*G03F 7/20* (2006.01)
*G02B 26/08* (2006.01)
*G02B 27/28* (2006.01)

(56) References Cited

U.S. PATENT DOCUMENTS

| | | |
|---|---|---|
| 2006/0192937 A1 | 8/2006 | Van De Kerkhof et al. |
| 2007/0046921 A1* | 3/2007 | Takahashi et al. .............. 355/71 |
| 2010/0118288 A1 | 5/2010 | Van De Kerkhof et al. |
| 2010/0220303 A1 | 9/2010 | Fiolka |
| 2013/0077077 A1 | 3/2013 | Saenger et al. |

OTHER PUBLICATIONS

International Preliminary Report on Patentability for corresponding PCT Appl No. PCT/EP2013/054167, dated Sep. 25, 2014.

* cited by examiner

METHOD FOR ADJUSTING AN OPTICAL SYSTEM OF A MICROLITHOGRAPHIC PROJECTION EXPOSURE APPARATUS

CROSS REFERENCE TO RELATED APPLICATIONS

This application is a continuation of, and claims benefit under 35 USC 120 to, international application PCT/EP2013/054167, filed Mar. 1, 2013, which claims priority of German Patent Application DE 10 2012 203 944.9 and U.S. 61/610,545, both filed on Mar. 14, 2012. The content of these applications is hereby incorporated by reference.

BACKGROUND OF THE INVENTION

1. Field of the invention

The invention relates to a method for adjusting an optical system of a microlithographic projection exposure apparatus.

2. Prior art

Microlithography is used for producing microstructured components such as e.g. integrated circuits or LCDs. The microlithography process is carried out in a so-called projection exposure apparatus, which has an illumination device and a projection lens. Here, the image of a mask(=reticle) illuminated via the illumination apparatus is projected via the projection lens onto a substrate (e.g. a silicon wafer), which is coated with a light-sensitive layer (photoresist) and arranged in the image plane of the projection lens, in order to transfer the mask structure onto the light-sensitive coating of the substrate.

During the operation of a microlithographic projection exposure apparatus, there is the need to set defined illumination settings, i.e. intensity distributions in a pupil plane of the illumination device, in a targeted manner. To this end, in addition to the use of diffractive optical elements (so-called DOEs), the use of mirror arrangements has also been disclosed, for example in WO 2005/026843 A2. Such mirror arrangements comprise a multiplicity of micro-mirrors which can be set independently of one another.

Furthermore, a number of different approaches are known for setting, in the illumination device, specific polarization distributions in the pupil plane and/or in the reticle in a targeted manner for the purpose of optimizing the imaging contrast. In particular, it is known to set a tangential polarization distribution in both the illumination device and the projection lens for the purpose of contrast-rich imaging. "Tangential polarization" (or "TE polarization") is understood to mean a polarization distribution in which the oscillation planes of the electric field strength vectors of the individual linearly polarized light rays are oriented approximately perpendicularly to the radius directed at the optical system axis. By contrast, a "radial polarization" (or "TM polarization") is understood to mean a polarization distribution in which the oscillation planes of the electric field strength vectors of the individual linearly polarized light rays are oriented approximately radially to the optical system axis.

In respect of the prior art, reference is made, for example, to WO 2005/069081 A2, WO 2005/031467 A2, U.S. Pat. No. 6,191,880 B1, US 2007/0146676 A1, WO 2009/034109 A2, WO 2008/019936 A2, WO 2009/100862 A1, DE 10 2008 009 601 A1, DE 10 2004 011 733 A1 and US 2011/0228247 A1.

Here, a possible approach for flexible setting of the polarization distribution comprises the use of a polarization-influencing optical arrangement made of a plurality of polarization-influencing components, which are arranged such that they are displaceable transversely with respect to the light-propagation direction, in combination with a mirror arrangement which comprises a multiplicity of mirror elements which can be adjusted independently of one another. Here, depending on the degree of cover of the mirror arrangement by the polarization-influencing components, in conjunction with a likewise variable setting of the mirror elements of the mirror arrangement, it is possible, in a flexible manner, to realize different polarization distributions in the pupil plane of the illumination device.

However, in the case of this approach, the problem that can occur in practice is that if the polarization-influencing components are not positioned precisely, one example being the inadvertent partial or complete cover of one or more mirror elements by one or more polarization-influencing components of the polarization-influencing arrangement, then components of the light reflected in the pupil plane by the mirror arrangement are actuated with an incorrect polarization state, and so the polarization distribution obtained in the pupil plane deviates from the desired polarization distribution. Overall, this can result in an adverse effect on the performance of the projection exposure apparatus as a result of imaging errors, and in a loss of contrast.

SUMMARY OF THE INVENTION

It is an object of the present invention to provide a method for adjusting an optical system of a microlithographic projection exposure apparatus, which allows a flexible setting of different polarization distributions with a greater accuracy and which avoids imaging errors induced hereby.

This object is achieved as per the features of a method for adjusting an optical system in a microlithographic projection exposure apparatus. The optical system comprises: a mirror arrangement with a plurality of mirror elements, which can be adjusted independently from one another for changing an angular distribution of the light reflected by the mirror arrangement; and a polarization-influencing optical arrangement which has at least one polarization-influencing component, wherein it is possible to set in variable fashion a degree of overlap between the polarization-influencing component and the mirror arrangement by displacing this polarization-influencing component. The method comprises the following steps: a) establishing, for a given actual position of the polarization-influencing component, a distribution of IPS values in a pupil plane of the projection exposure apparatus, wherein each IPS value denotes the degree of realization of a predetermined polarization state for a light ray reflected at a respective mirror element of the mirror arrangement; and b) changing the position of the polarization-influencing component on the basis of the distribution established in step a).

A method according to the invention for adjusting an optical system of a microlithographic projection exposure apparatus, wherein the optical system comprises a mirror arrangement with a plurality of mirror elements, which can be adjusted independently from one another for changing an angular distribution of the light reflected by the mirror arrangement, and a polarization-influencing optical arrangement which has at least one polarization-influencing component, wherein it is possible to set in variable fashion a degree of overlap between the polarization-influencing component and the mirror arrangement by displacing this polarization-influencing component, comprises the following steps:

establishing, for a given actual position of the polarization-influencing component, a distribution of IPS values in a pupil plane of the projection exposure apparatus, wherein each IPS value denotes the degree of realization of a predetermined polarization state for a light ray reflected at a respective mirror element of the mirror arrangement; and changing the position of the polarization-influencing component on the basis of the previously established distribution.

In particular, the present invention is based on the idea of adjusting a polarization-influencing optical component, which is present in conjunction with a mirror arrangement for flexible setting of different polarization states, on the basis of a polarization measurement, as a result of which, firstly, account is taken of the fact that, as a result of the high degree of transmission of the order of 99.9% applying to polarization-influencing components that can typically be used, a transmission measurement, which in principle is also feasible, is not readily suitable for a positional calibration or positional adjustment of the polarization-influencing component since the intensity differences established during such a calibration are of the order of the background noise, or even lower. The polarization measurement carried out according to the invention furthermore comprises determination of a distribution of IPS values for the light rays reflected at individual mirror elements of the mirror arrangement, wherein a change to be undertaken of the actual position of the polarization-influencing component is deduced directly from the established IPS values.

Here, the invention in particular makes use of the adjustability of the individual mirror elements of the mirror arrangement, wherein the light spots generated in the pupil plane within the scope of establishing the distribution of IPS values can be arranged in a suitable fashion. Here it is possible during the evaluation, in particular, not to consider mirror elements which are not in the region of an edge of the polarization-influencing component or which have a degree of overlap with the polarization-influencing component of 100% or zero and, to this end, preferably to direct these mirror elements at a separate region in the pupil plane or toward a beam trap.

According to one embodiment, mirror elements whose distance from an edge of the polarization-influencing component exceeds a predetermined threshold remain unconsidered when determining the distribution of IPS values. This predetermined threshold can, in particular, correspond to at least the width of one mirror element of the mirror arrangement, furthermore in particular to at least double the value of the width of a mirror element of the mirror arrangement, and furthermore in particular to three times the value of the width of a mirror element of the mirror arrangement.

According to one embodiment, light reflected at the mirror elements which remain unconsidered is deflected into a separate region in the pupil plane or toward a beam trap.

According to one embodiment, the distribution of IPS values is established using at least one polarization-measuring instrument, preferably an array of polarization-measuring instruments, which is arranged in the reticle plane of the projection exposure apparatus.

Since such a polarization-measuring instrument (or array of polarization-measuring instruments) is generally already present anyway in the system in situ or on the part of the customer, the calibration or adjustment according to the invention can optionally already be undertaken directly in situ and without complicated disassembly of the system.

According to one embodiment, the change in the position of the polarization-influencing component is brought about in such a way that an edge of the polarization-influencing component projected on the mirror arrangement is arranged between two adjacent rows or columns of mirror elements.

According to one embodiment, the steps of establishing the distribution of IPS values and of changing the position of the polarization-influencing component on the basis of the established distribution are carried out repeatedly for approximating an intended position of the polarization-influencing component.

According to one embodiment, the polarization-influencing component is a lambda/2 plate.

According to one embodiment, the polarization-influencing component is made of optically active material, in particular crystalline quartz with an optical crystal axis orientation which is parallel to the light-propagation direction.

According to a further aspect, the invention relates to a method for adjusting an optical system in a microlithographic projection exposure apparatus, wherein the optical system comprises:

a mirror arrangement with a plurality of mirror elements, which can be adjusted independently from one another for changing an angular distribution of the light reflected by the mirror arrangement, and a polarization-influencing optical arrangement which has at least one polarization-influencing component, wherein it is possible to set in variable fashion a degree of overlap between the polarization-influencing component and the mirror arrangement by displacing this polarization-influencing component; wherein the method comprises the following steps:

placing an edge of the polarization-influencing component into the beam path of the optical system;

carrying out an IPS measurement for light incident on the pupil plane after reflection on mirror elements of the mirror arrangement; and establishing a positional change of the polarization-influencing component required for generating a desired polarization distribution on the basis of the IPS measurement carried out.

According to one embodiment, mirror elements whose distance from the edge exceeds a predetermined threshold remain unconsidered when carrying out the IPS measurement.

According to one embodiment, mirror elements whose degree of overlap with the polarization-influencing component is 100% or zero remain unconsidered when carrying out the IPS measurement.

According to one embodiment, light reflected at these mirror elements which remain unconsidered is deflected into a separate region in the pupil plane or toward a beam trap.

Further embodiments of the invention can be gathered from the following description and from the dependent claims.

The invention will be explained in more detail below on the basis of preferred exemplary embodiments, and with reference being made to the attached figures.

BRIEF DESCRIPTION OF THE DRAWINGS

In detail:

FIGS. 4-5a-5b, 6a-6c, 7a-7c, 8a-8b show schematic illustrations for explaining a concept according to the invention for calibrating or adjusting a polarization-influencing optical arrangement used in the exemplary embodiments of FIG. 2 or FIG. 3a-e.

DETAILED DESCRIPTION OF PREFERRED EMBODIMENTS

Figure 1:
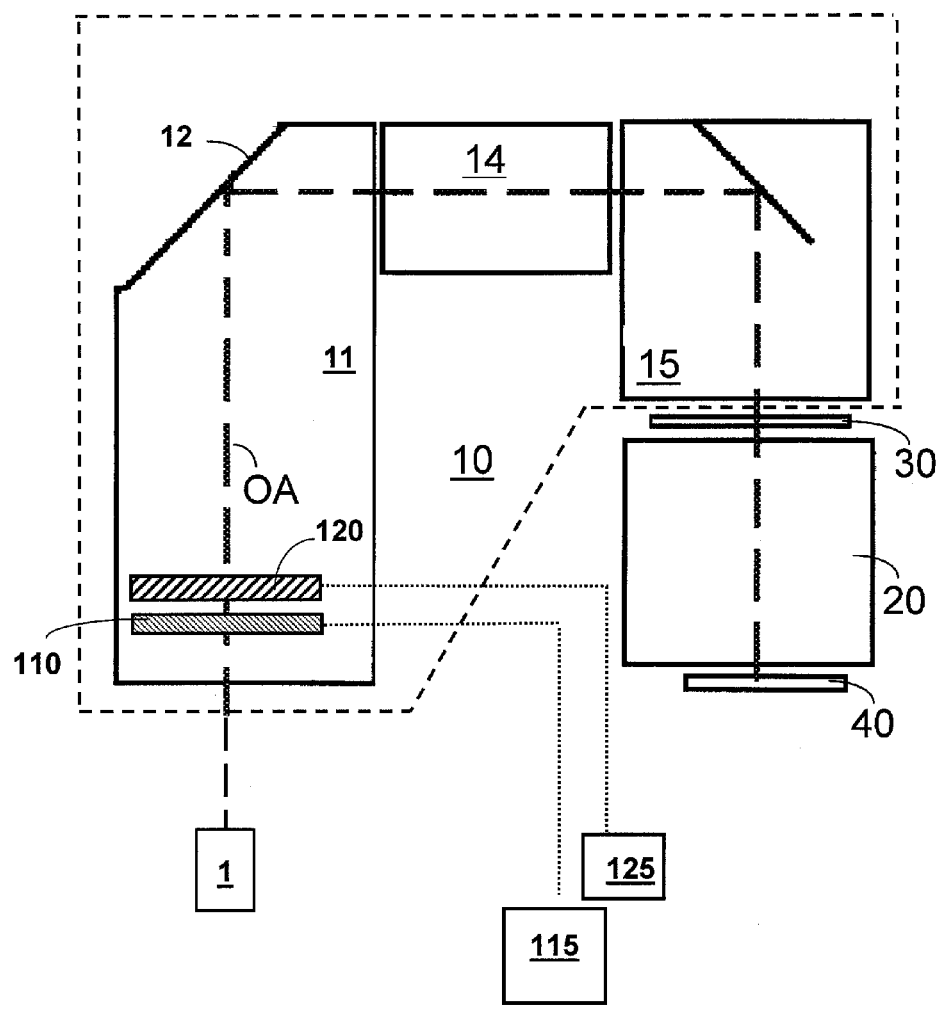
FIG. 1 shows a schematic illustration of the design of a microlithographic projection exposure apparatus, in which the present invention can be realized.

In the following text, a basic design of a microlithographic projection exposure apparatus with an optical system according to the invention is first of all explained with reference to FIG. 1. The projection exposure apparatus has an illumination device 10 and a projection lens 20. The illumination device 10 serves for illuminating a structure-bearing mask (reticle) 30 with light from a light-source unit 1, which comprises, for example, an ArF excimer laser for an operating wavelength of 193 nm and a ray-shaping optical unit that generates a parallel light beam. In general, the illumination device 10 and the projection lens 20 are preferably designed for an operating wavelength of less than 400 nm, in particular of less than 250 nm, furthermore in particular of less than 200 nm.

In particular, according to the invention, a mirror arrangement 120, which has a multiplicity of mirror elements which can be set independently of one another, is part of the illumination device 10. A polarization-influencing optical arrangement 110, which will be explained in more detail below with reference to FIG. 2 et seq. is arranged upstream of the mirror arrangement 120 in the light-propagation direction. According to FIG. 1, provision is furthermore made for actuation units 115, 125 which are associated with the polarization-influencing optical arrangement 110 and with the mirror arrangement 120 and respectively enable the adjustment thereof via suitable actuators. Actuators for adjusting the arrangements can be designed in whatever way required, for example as belt drives, flexure elements, piezo-actuators, linear drives, DC current (DC) motors with or without gearing, spindle drives, toothed-belt drives, gear drives or as combinations of these known components.

The illumination device 10 has an optical unit 11, which, in the illustrated example, inter alia comprises a deflection mirror 12. Downstream of the optical unit 11 in the light-propagation direction and in the beam path, there is a light mixing device (not illustrated), which can have, for example, in a manner known per se, an arrangement made of micro-optical elements that is suitable for achieving light mixing, and also a lens-element group 14, downstream of which is situated a field plane with a reticle masking system (REMA), which is imaged by an REMA lens 15 disposed downstream in the light-propagation direction onto the structure-bearing mask (reticle) 30 arranged in a further field plane and thereby delimits the illuminated region on the reticle. The structure-bearing mask 30 is imaged by the projection lens 20 onto a substrate 40, or a wafer, provided with a light-sensitive layer. The projection lens 20 can be designed, in particular, for immersion operation. Furthermore, it can have a numerical aperture NA of greater than 0.85, in particular greater than 1.1.

Figure 2:
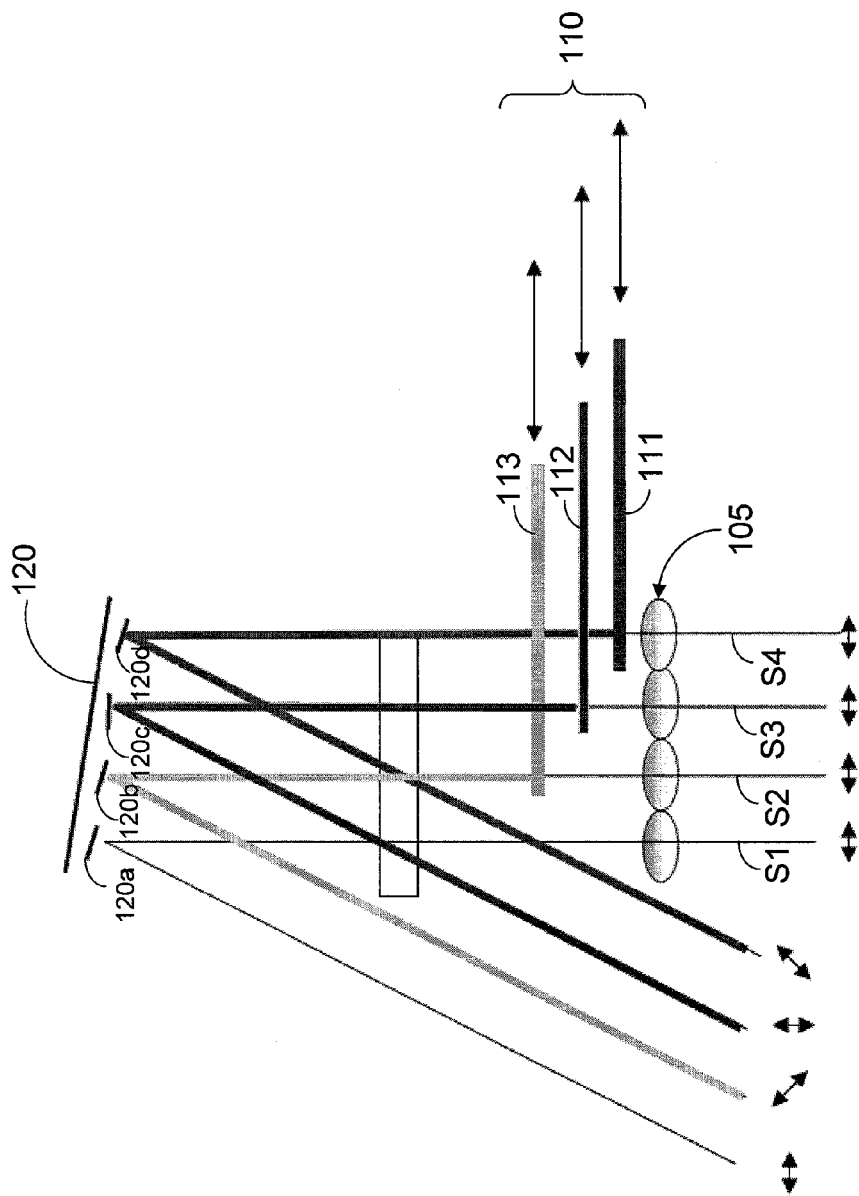
FIGS. 2-3a-3e show schematic illustrations for explaining possible embodiments for flexible setting of different polarization states.

According to FIG. 2, the mirror arrangement 120 has a multiplicity of mirror elements 120a, 120b, 120c, . . . . The mirror elements 120a, 120b, 120c, . . . are adjustable independently of one another for changing an angular distribution of the light reflected by the mirror arrangement 120, to which end, as per FIG. 1, the actuation unit 125 serves. In the exemplary embodiment, a micro-lens arrangement 105, not shown in FIG. 1 but indicated schematically in FIG. 2, is also situated upstream of the mirror arrangement 120 in the light-propagation direction and it has a multiplicity of micro-lenses for targeted focusing on the mirror elements of the mirror arrangement in order to avoid light losses and the generation of stray light in the regions between the individual mirrors (by blooming of the individual mirrors). The mirror elements 120a, 120b, 120c, . . . can respectively be tilted individually, for example in an angular range from −2° to +2°, in particular −5° to +5°, furthermore in particular −10° to +10°. As a result of a suitable tilting arrangement of the mirror elements 120a, 120b, 120c, . . . in the mirror arrangement 120, a desired light distribution, e.g. an annular illumination setting or else a dipole setting or quadrupole setting, can be formed in the pupil plane PP, by virtue of the previously homogenized and collimated laser light being respectively deflected in the corresponding direction by the mirror elements 120a, 120b, 120c, . . . , depending on the desired illumination setting.

FIG. 2 first of all serves to explain the interaction of the polarization-influencing optical arrangement 110, already mentioned in conjunction with FIG. 1, with the mirror arrangement 120.

In the exemplary embodiment of FIG. 2, the polarization-influencing optical arrangement 110 has three components, which can be adjusted independently of one another and can be respectively inserted into the beam path perpendicularly to the light-propagation direction, in the form of optical rotators made of optically active crystalline quartz, wherein each of these rotators individually brings about a rotation of the preferred direction of polarization by 45° for light that passes therethrough. As a result of this, the preferred direction of polarization is rotated by 45° if light passes through only one rotator 111, 112 or 113, by 90° if it passes through two of these rotators 111-113 and by 135° (or −45°) if it passes through all rotators 111-113. This situation is illustrated in FIG. 2, wherein the indicated double-headed arrows for the partial beams S1-S4 each denote the preferred direction of polarization seen in the z-direction (when observed in the x-y plane). Here, the partial beam S1 does not pass through any of the rotators 111-113, and so the preferred direction of polarization (which corresponds to the x-direction in this example) remains unchanged for this partial beam.

The micro-lens arrangement 105 is likewise illustrated merely schematically in FIG. 2 and it, as mentioned previously, respectively focuses the individual partial beams on mirror elements 120a, 120b, 120c, 120d, . . . of the mirror arrangement 120. The placement of this micro-lens arrangement 105 is merely exemplary, wherein, in further exemplary embodiments, the micro-lens arrangement 105 can also be arranged after the polarization-influencing optical arrangement 110, or downstream thereof, in the light-propagation direction.

Depending on the degree of cover of the mirror arrangement 120 by the polarization-influencing components 111, 112, 113, it is possible, in conjunction with the variable setting of the mirror elements 120a, 120b, 120c, . . . of the mirror arrangement 120, to realize different polarization distributions in the pupil plane of the illumination apparatus in a flexible manner using the design from FIG. 2.

Figure 3A:
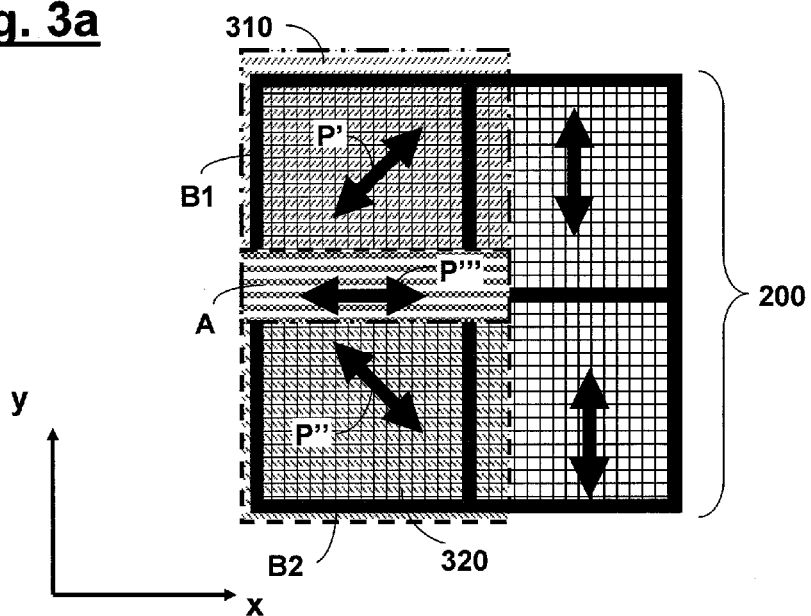
Figure 3B:
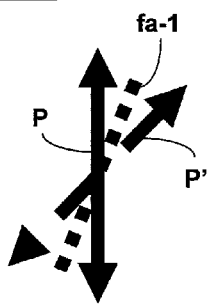

FIG. 3a shows a schematic illustration of the polarization-influencing optical arrangement 300 as per a further embodiment of the invention. According to FIG. 3a, the polarization-influencing optical arrangement 300 comprises lambda/2 plates 310, 320 which partly overlap one another and are respectively made of a suitable birefringent material that is sufficiently transparent at the desired operating wavelength; for example, they are made of magnesium fluoride ($MgF_2$), sapphire ($Al_2O_3$) or crystalline quartz ($SiO_2$). Moreover, without the invention being restricted to this, the lambda/2 plates 310, 320 respectively have a rectangular geometry, matching the geometry of the mirror arrangement 200.

FIG. 3a likewise depicts, for the case of the incidence of linearly polarized light having a constant preferred direction of polarization P running in the y-direction, the preferred directions of polarization respectively arising after light passage through the polarization-influencing optical arrangement 300. In this case, the preferred direction of polarization respectively arising is designated by P' for the first non-overlap region "B-1" (i.e. the region covered only by the first lambda/2 plate 310), by P''' for the second non-overlap region "B-2" (i.e. the region covered only by the second lambda/2 plate 320) and by P'' for the overlap region "A" (i.e. the region covered both by the first lambda/2 plate 310 and by the second lambda/2 plate 320). How the respective preferred directions of polarization arise in the aforementioned regions is illustrated schematically in FIGS. 3b-3e, wherein the respective position of the fast birefringent axis (which extends in the direction of high refractive index) is indicated by the dotted line "fa-1" for the first lambda/2 plate 310 and by the dotted line "fa-2" for the second lambda/2 plate 320. In the exemplary embodiment, the fast axis "fa-1" of the birefringence of the first lambda/2 plate 310 extends at an angle of 22.5°±2° with respect to the preferred direction of polarization P of the light beam incident on the arrangement 300 (i.e. with respect to the y-direction), and the fast axis "fa-2" of the birefringence of the second lambda/2 plate 320 extends at an angle of −22.5°±2° with respect to the preferred direction of polarization P of the light beam incident on the arrangement 300.

Figure 3C:
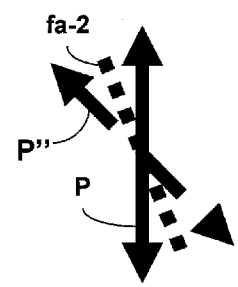
Figure 3D:
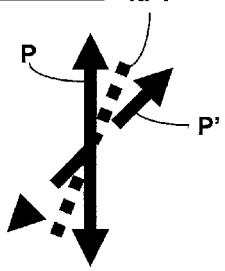
Figure 3E:
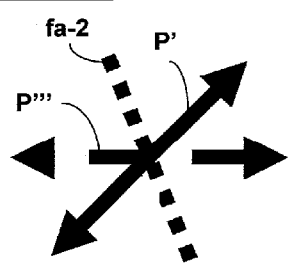

The preferred direction of polarization P' emerging after light passes through the first lambda/2 plate 310 corresponds to a mirroring of the original (input) preferred direction of polarization P on the fast axis "fa-1" (cf. FIG. 3b), and the preferred direction of polarization P''' emerging after light passes through the second lambda/2 plate 320 corresponds to a mirroring of the original (input) preferred direction of polarization P on the fast axis "fa-2" (cf. FIG. 3c). It follows that the preferred directions of polarization P' and P''' arising after light passes through the non-overlap regions "B-1" and "B-2" extend at an angle of +45° to the preferred direction of polarization P of the light beam incident on the arrangement 300. For the light beam incident on the arrangement 300 in the overlap region "A", the following applies: the preferred direction of polarization P' of the light beam emerging from the first lambda/2 plate 310 (cf. FIG. 3d) corresponds to the input polarization distribution of the light beam incident on the second lambda/2 plate 320, and so the preferred direction of polarization, denoted by P'''' in FIG. 3e, of the light beam emerging from the overlap region "A" extends at an angle of 90° to the preferred direction of polarization P of the light beam incident on the arrangement 300.

In the following text and with reference to FIG. 4, a problem treated by the present invention which occurs in practice in the above-described approaches for flexible setting of the polarization is described first.

Figure 4:
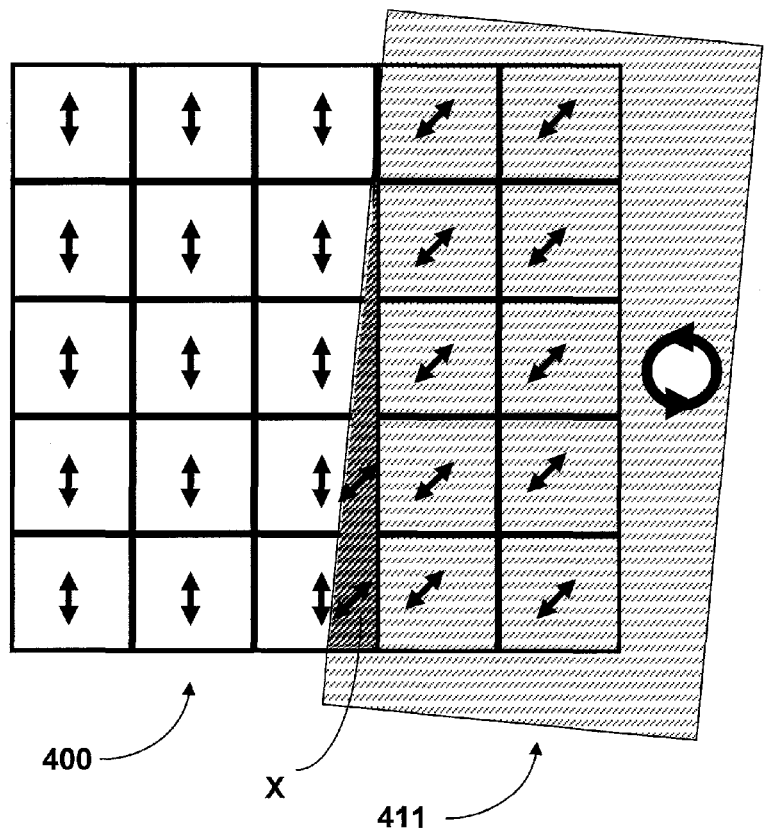

FIG. 4 initially in turn shows the placement of a polarization-influencing component 411 of a polarization-influencing optical arrangement 410 in front of a mirror arrangement 400 in the light-propagation direction. By way of example, this component 411 can be one of the rotators 111, 112, 113 of the polarization-influencing optical arrangement 110 from FIG. 2, or else one of the lambda/2 plates 310, 320 from FIGS. 3a-e.

Here, a situation is assumed in FIG. 4 in which the component 411 has not been precisely positioned in respect of the mirror arrangement 400, i.e. there is a deviation of the actual position of the component 411 relative to the intended position thereof. As exemplified in FIG. 4, this deviation of the actual position from the intended position leads to "incorrect" polarization states of the light passing through the component 411 being set in a region (denoted by "X" and shaded in FIG. 4), which in turn results in an undesirable reduction in the IPS value which characterizes the degree of the implementation of the desired polarization state.

The invention now proceeds, in particular, from the idea that a precise determination of the above-described positioning error (i.e. the deviation of the actual position of the component 411 relative to the intended position thereof) cannot readily be brought about to a sufficient extent by way of a transmission measurement since the transmission of a component of the polarization-influencing optical arrangement utilized in FIGS. 2-4 (i.e. of the rotators 111, 112, 113 or of the lambda/2 plates 310, 320) can typically be of the order of, for example, 99.9%.

According to the invention, instead of a transmission measurement, there is a measurement of the polarization set by the arrangement of FIG. 4 itself, for which purpose use is made of a suitable polarization-measuring instrument.

Figure 5:
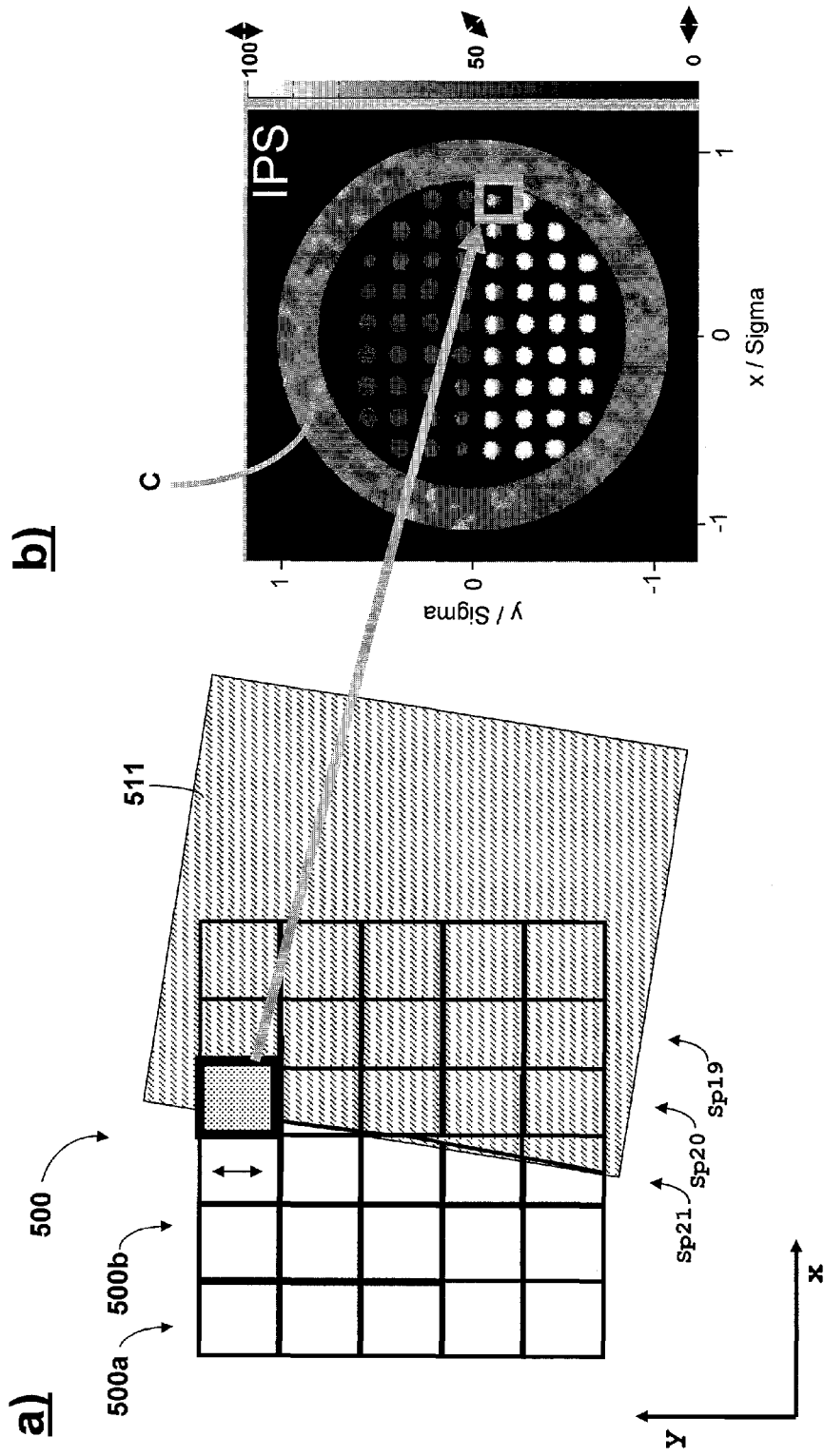

FIGS. 5a-5b, serves to explain the principle, used according to the invention, for this polarization measurement. Here, light reflected at the individual mirror elements 500a, 500b, . . . of the mirror arrangement 500 is in each case deflected separately into the pupil plane (illustrated in FIG. 5b), wherein each individual mirror element 500a, 500b, . . . can be measured in respect of the polarization state associated with the light ray reflected at this mirror element via the component 511 of the polarization-influencing optical unit. In other words, according to FIGS. 5a-5b, there is respectively separate imaging of the mirror elements 500a, 500b, . . . of the mirror arrangement into the pupil plane, wherein the measurement according to the invention is used to establish the polarization state of the light reflected at the respective mirror elements.

Figure 6:
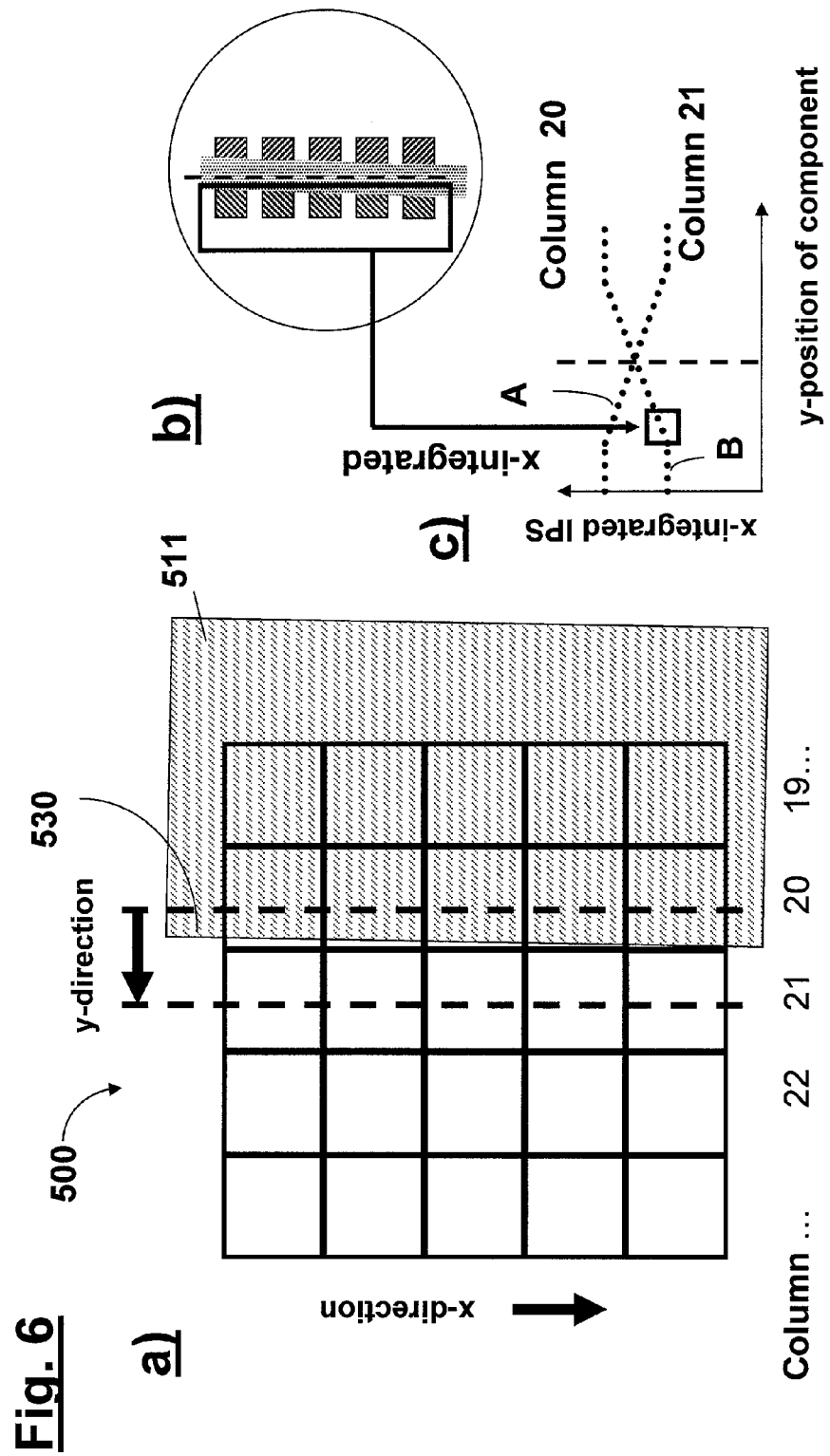
Figure 8:
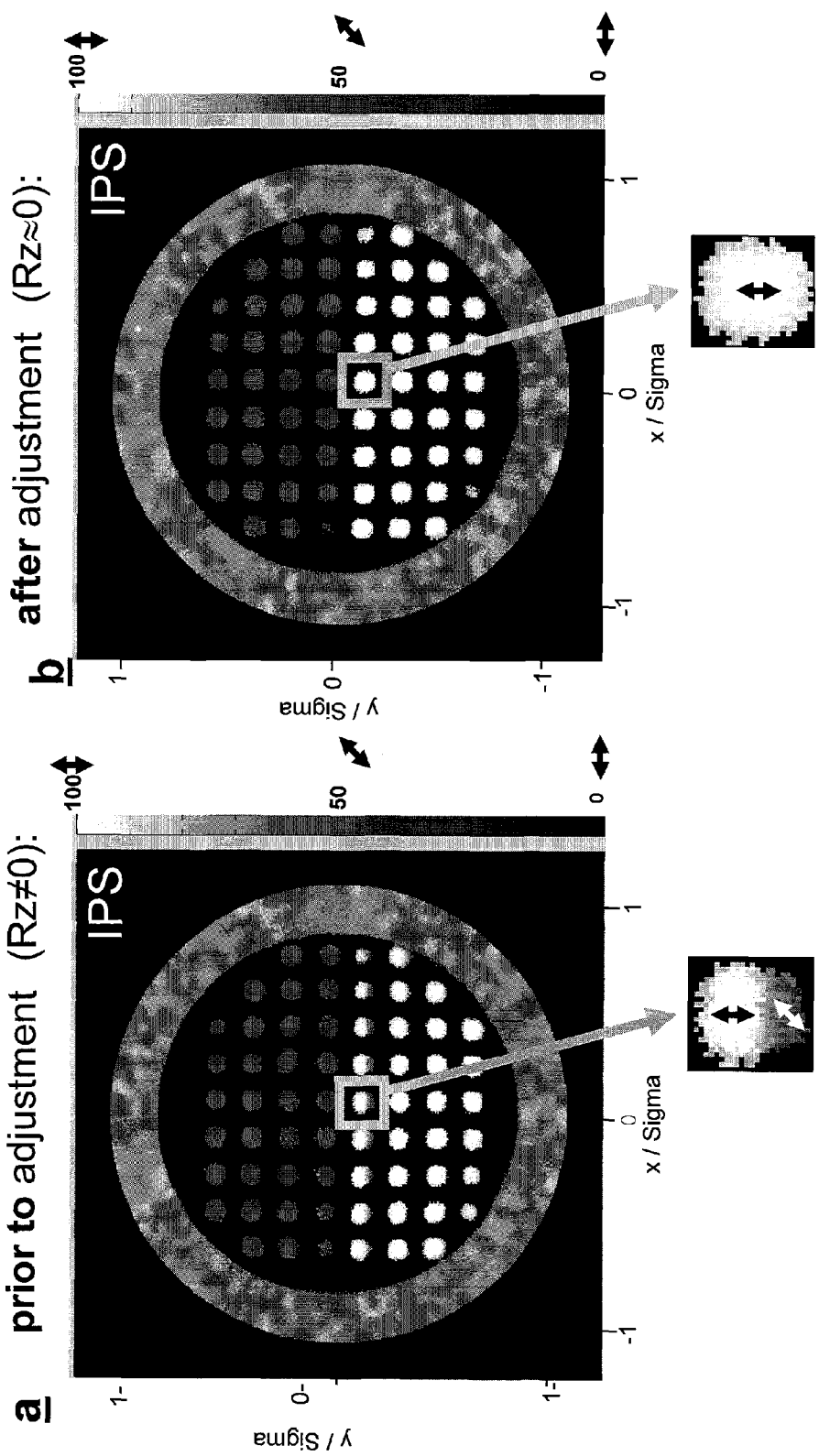

In particular, in order to carry out the polarization measurement, it is now possible, instead of using the reticle or the mask which is used in the actual lithography process and has the structures to be imaged, to use an array (which is sometimes also referred to as "polarization reticle"), i.e. a matrix-shaped arrangement, of polarization-measuring instruments or polarimetry components, wherein each of these polarization-measuring instruments is made of a lambda/4 plate, a polarization beamsplitter cube and a photosensitive detector, wherein the three aforementioned components directly follow one another in the light-propagation direction. In respect of exemplary embodiments of a suitable polarization-measuring instrument or polarimetry component, reference is made in an exemplary fashion to US 2011/0032502 A1 (cf. there FIG. 4), US 2010/0208264 A1 (cf. there FIG. 6) and WO 2007/033710 A1 (cf. there FIG. 8).

Here, the individual lambda/4 plates of this matrix-shaped arrangement differ from one another in terms of the alignment of the respective fast axis of the birefringence, and so, by displacing the matrix-shaped arrangement within the relevant plane perpendicular to the light-propagation direction, it is possible to place another lambda/4 plate in the light path together with the respectively associated polarization beamsplitter cube and the respectively associated photosensitive detector. In other words, by displacing the described matrix-shaped arrangement of polarization-measuring instruments, it is respectively possible to position a lambda/4 plate in the light path which, in respect of the orientation of the fast axis of the birefringence thereof, is rotated by a predetermined angle with respect to the adjacent (e.g. previously used) lambda/4 plate.

The invention is not restricted to the use of the above-described embodiment of an array of polarization-measuring instruments. In further embodiments, it is also possible to carry out the intensity measurement, which in the above-described embodiment was carried out by the photosensitive detector of each polarization-measuring instrument, on the wafer plane, in which case the matrix-shaped arrangement in the reticle plane merely comprises the lambda/4 plates with the respectively associated polarization beamsplitter cube.

The different orientations of the lambda/4 plates in the polarization-measuring instruments of the above-described matrix-shaped arrangement leads to a modulated intensity signal, from which it is possible, in turn, to establish the Stokes vector of the incident light by way of a Fourier transform.

The invention therefore is advantageous, in particular, in that installation and calibration of the polarization-influencing optical arrangement used for flexible setting in the illumination apparatus can be carried out directly in situ or by the customer and without complicated disassembly of the system. Thus, according to the invention, it is possible, for example, to use a "polarization reticle", which is often available in any case during use of the projection exposure apparatus or in situ with the customer, or an arrangement of polarization-measuring instruments with the above-described design for the purpose of undertaking a calibration of the components available for flexible setting of the polarization, namely of the polarization-influencing optical arrangement in combination with the mirror arrangement of mirror elements which can be adjusted independently of one another.

Referring again to FIGS. 5a-5b, in the specific exemplary embodiment, the mirror elements 500a, 500b, ... which are not situated in the vicinity of the edge or border of the component 511 of the polarization-influencing optical arrangement 510 over the mirror arrangement 500 are now directed at an annular region "C" in the pupil plane (comparable here with the generation of a so-called "annular" illumination setting via the relevant mirror elements 500a, 500b, ...). FIG. 5b illustrates the result of measuring the IPS value or the distribution thereof over the pupil plane in pupil coordinates.

Here, the component 511 of the polarization-influencing optical arrangement 510 in the exemplary embodiment brings about a rotation of the polarization direction of light passing therethrough about a polarization rotational angle of 45°, for the purpose of which it can, for example analogously to the exemplary embodiment in FIG. 2, be made of optically active crystalline quartz of suitable thickness and with an optical crystal axis pointing in the light-propagation direction. In a further exemplary embodiment, the component 511 of the polarization-influencing optical arrangement 500 can, for example, also be a lambda/2 plate, in which the fast axis of the birefringence is oriented at an angle of 22.5° with respect to the input polarization of the incident light.

Moreover, in the example of FIGS. 5a-5b, the preferred polarization state on which the IPS value is based is selected as "y-polarization" (with respect to the illustrated coordinate system), wherein this y-polarization is obtained for the mirror elements of the mirror arrangement 500 which are not covered by the component 511 of the polarization-influencing optical arrangement 510. By contrast, for the light components subjected to a polarization rotation by 45° relative to the y-axis as a result of overlap by the component 511 of the polarization-influencing optical arrangement 510, or for the corresponding mirror elements of the mirror arrangement 500, this results in an IPS value of 0.5 (since, in a manner of speaking, half of this light has x-polarization and the other half has y-polarization).

As already mentioned previously, all mirror elements not situated in the region of the edge of the component 511 are, as per FIGS. 5a-5b, tilted in such a manner that the light reflected at these mirror elements is, in the example, deflected into the region "C" in the pupil plane. In a manner of speaking, this region "C" comprises "park positions" for those mirror elements (or the light rays reflected thereon) which are currently not of interest or irrelevant to the calibration according to the invention since they are covered not at all or completely by the relevant polarization-influencing component 511.

By contrast, relevant to the calibration according to the invention are the mirror elements situated in the region of the edge of the component 511 of the polarization-influencing optical arrangement 510, wherein, in this case of the specific example as per FIGS. 5a-5b, these are the mirror elements of the mirror arrangement 500 situated in the two central columns "Sp20" and "Sp21" as per FIG. 5a. These last-mentioned mirror elements in columns "Sp20" and "Sp21" are now directed individually at the region in the pupil plane situated within the edge region "C".

As a result of this, there is a precise association between respectively one of the relevant mirror elements of the mirror arrangement 500 and a point in the pupil plane. By way of example, the uppermost mirror of column "Sp21" in FIG. 5a corresponds to the illumination spot obtained as per FIG. 5b in the bottom right position within the region "C" of the pupil plane, etc. An IPS value of 100% results for this mirror element, which indicates that this mirror element is not at all covered by the component 511 of the polarization-influencing optical arrangement 510 (i.e. it has a degree of overlap of zero with the polarization-influencing component 511). While an identical result emerges for the second mirror element of the mirror arrangement 500, a modified IPS value is obtained for the third mirror element, as seen from above, of the mirror arrangement 500; this modified IPS value indicates partial cover of this mirror element by the component 511 (i.e. a degree of overlap of greater than zero and less than one with the polarization-influencing component 511), with this deviation increasing further in the following mirror elements with increasing cover by the component 511.

Something similar applies to the transition from mirror elements in the edge region of the component 511, which are completely covered by the component 511 (the two lower left mirror elements in column "Sp20" of the mirror arrangement 500 as per FIG. 5a) to mirror elements of the mirror arrangement 500 in which there only is partial cover by the component 511 and, accordingly, a change in the IPS value compared to the value of 0.5 obtained for the completely covered mirror elements.

According to the invention, it is now possible in each case to establish, for different positions or rotational angles of the component 511 relative to the mirror arrangement 500, the associated IPS distribution analogous to FIG. 5b. By evaluating the IPS distributions obtained thus, it is now possible to establish, for each corresponding position of the component 511 relative to the mirror arrangement 500, the extent to which the individual mirror elements of the mirror arrangement 500 are respectively covered by the component 511, etc.

In other words, it is then possible, if a rotational angle of 5° clockwise emerges from the measured IPS distribution for a specific position of the component 511 relative to the mirror arrangement 500, to carry out an adjustment by rotating the component 511 by the identical angle counterclockwise. In an analogous fashion to such a correction of an incorrect rotation (corresponding to the Rz degree of freedom), it is also possible to establish and correct an incorrect displacement of the polarization-influencing component 511 (corresponding approximately to the degree of freedom x, i.e. a displacement in the x-direction).

Within the scope of the above-described method for calibration, the respective settings of the mirror elements of the mirror arrangement in particular are selected in an expedient or skilled fashion, as, from the outset, only the mirror elements situated in the region of the edge of the relevant polarization-influencing component of the polarization-influencing optical arrangement are used when determining the distribution of the IPS value in the pupil plane, whereas the mirror elements situated at a distance from this edge are, from the outset, directed at a region not taken into account during the IPS evaluation.

The region not taken into account during the IPS evaluation can alternatively either (like in the example of FIGS. 5a-5b) be an edge region of the pupil plane or else be a "capture region" outside of the system (e.g. in the form of a stop or beam trap for the light from corresponding mirror elements "not required" for the calibration).

In other words, according to the invention, a region within the pupil plane is only illuminated via the mirror elements of the mirror arrangement "of interest" (since being situated in the region of the edge of the respective component of the polarization-influencing optical arrangement) to the calibration or adjustment, according to the invention, of the polarization-influencing optical arrangement.

For the purposes of the actual adjustment, the relevant component of the polarization-influencing optical arrangement can either be introduced step-by-step into the beam path from a predetermined start or abutment position or be placed from the outset into an estimated start position expected to lie in the vicinity of the intended position. Thereupon it is possible, via the above-described determination of the IPS distribution obtained for this position of the component, to establish a possible incorrect positioning and correct this by way of a suitable displacement and/or rotation of the component. In particular, when establishing the IPS distribution, in turn only those mirror elements are used which are arranged in the vicinity (e.g. to the left and right about the width of a mirror element about the intended position of the edge of the component).

As an alternative to the above-described, successive setting of different rotational angles of the relevant polarization-influencing component relative to the mirror arrangement, it is also possible to establish, on the basis of the "one-time" measurement of the IPS distribution (i.e. via measuring respectively one IPS value for each mirror element situated in the region of the edge of the component in a specific position of the component), the current incorrect orientation in respect of a rotation of the polarization-influencing component (corresponding to the degree of freedom Rz) by way of a linear regression, wherein, in each case, the linear increase or decrease in the IPS value obtained in the transition between neighboring mirror elements when rotating the component is evaluated mathematically to obtain a corresponding gradient and subsequently corrected accordingly.

According to the invention, use is particularly made of the fact that the individual mirror elements of the mirror arrangement used for flexible setting of a polarization distribution in the illumination device in conjunction with a polarization-influencing optical arrangement can be adjusted or tilted independently of one another, in order, namely via a corresponding alignment of these mirror elements in the pupil plane, to observe the polarization states obtained for the respective mirror elements individually and to evaluate these (in respect of the IPS value), wherein in turn this observation and evaluation can be restricted to a subset of the mirror elements, namely to the mirror elements which are situated in the region of an edge of the polarization-influencing component of the polarization-influencing optical arrangement and are therefore "of interest" or relevant to the calibration. In other words, the invention makes use of the fact that, in the arrangement with the mirror arrangement, used for flexible setting of the polarization state, the IPS value is evaluated in a mirror element-resolved or channel-resolved fashion and can be used for calibration and adjustment.

In the following text, a corresponding adjustment concept as per the invention will be described with reference to FIGS. 6a-6c, FIGS. 7a-7c and FIGS. 8a-8b.

With reference once again being made to FIGS. 5a-5b, an edge of the polarization-influencing component 511 is to be displaced during this adjustment in the y-direction in the plotted coordinate system in such a way that this edge is positioned centrally at the boundary between two adjacent columns (column 20 and 21 in FIG. 5a) of mirror elements of the mirror arrangement 500. Moreover, the corresponding mirror elements situated in the region of columns 20 and 21 situated in the region of the edge are aligned in the pupil plane (illustrated in FIG. 5b) in such a way that the corresponding light spots generated in the pupil plane are present in the same arrangement as the associated mirror elements of the two columns 20 and 21 of the mirror arrangement 500. By contrast, the mirror elements in columns 19, 22, etc. (which are covered either not at all or completely by the component 511 of the polarization-influencing optical arrangement) can remain unconsidered during the calibration and, for example, be directed at an outer edge region of the pupil plane or to a beam trap arranged outside of the imaging beam path.

In other words, during the calibration according to the invention, each mirror element situated in the region of the edge of the corresponding component to be adjusted of the polarization-influencing optical arrangement is initially used to generate a single light spot in the pupil plane.

According to FIG. 6b, in this process, the light spots generated by the mirror elements in column 20 of the mirror arrangement, which are covered by the component 511 of the polarization-influencing optical arrangement, lie to the left of the shaded line drawn in the pupil plane, whereas the light spots generated by the mirror elements in column 21 of the mirror arrangement, which are not covered by the component 511 of the polarization-influencing optical arrangement, are arranged to the right of the shaded line in the pupil plane.

In the next step, as indicated in FIGS. 6b-6c, the IPS values of the light spots now are integrated, both for the light spots generated by the mirror elements in column 20 of the mirror arrangement and for the light spots generated by the mirror elements in column 21 of the mirror arrangement 500, which respectively results in a data point in the diagram shown in FIG. 6c.

In the next step, there now is a displacement in the y-direction over a predetermined path interval (of e.g. $\Delta y=5$ μm) of the component 511 of the polarization-influencing optical arrangement over the mirror arrangement 500. If this displacement is to the left in FIG. 6a (i.e. in the positive y-direction), the integrated (IPS) value is reduced during a subsequent analog integration of the IPS values obtained for the mirror elements in column 21 of the mirror arrangement 500 if the component 511 in this case comes to rest to a greater extent over the corresponding mirror elements of column 21, whereas the correspondingly integrated (IPS) value, obtained by integration, for the mirror elements situated in column 20 of the mirror arrangement 500 decreases.

A step-by-step onward displacement of the component 511 of the polarization-influencing optical arrangement over the mirror arrangement 500 finally leads to the overall diagram, illustrated in FIG. 6c, being obtained. The ideal edge position of the component 511 of the polarization-influencing optical arrangement can now be assumed to be that y-position of the component 511, or the edge 530 thereof, at which the two curves in the diagram of FIG. 6c cross one another, since then the edge of the corresponding component 511 to be adjusted is positioned precisely centrally over columns 20, 21 of the mirror arrangement 500.

In addition to the above-described positioning of the component 511 of the polarization-influencing optical arrangement in the y-direction, the Rz-orientation is now set in a further step, i.e. what is set is the arrangement of the component in such a way that the latter is not rotated in an unwanted way about the z-axis (Rz degree of freedom). This step will be described in the following text with reference to FIGS. 7a-7c. Here, the assumption is first of all made that, in respect of the degree of freedom of the displacement in the y-direction, the optimum position of the component 511 of the polarization-influencing optical arrangement was found and set as described above.

Figure 7:
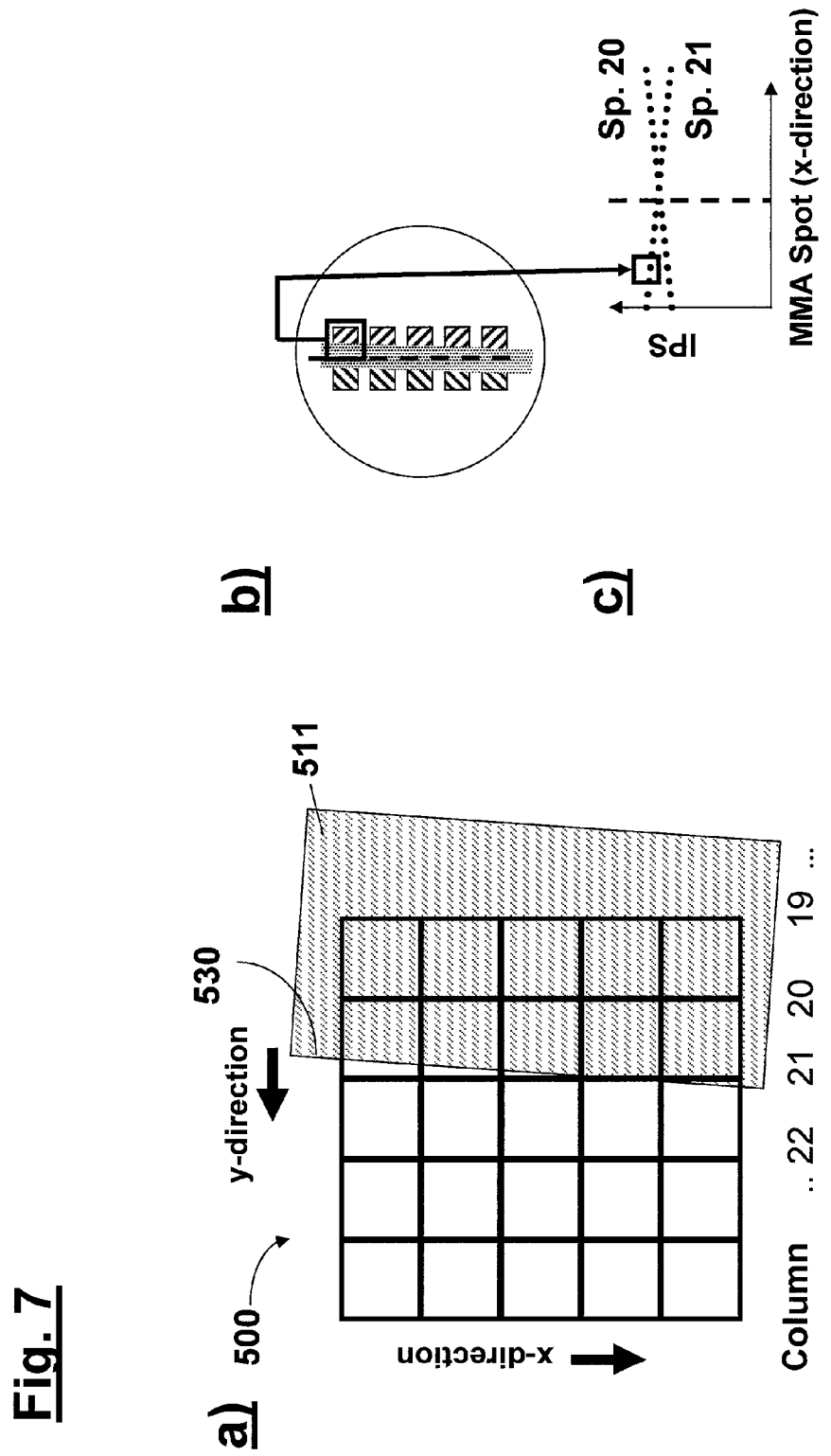

Now, according to FIGS. 7a-7c, in order to measure or optimize the Rz-orientation, an individual separate illumination spot is first of all generated in the pupil plane via each individual mirror element of the mirror arrangement 700 for the mirror elements situated in the region of the edge of the component 711, and the associated IPS value for the individual light spots is measured. However, in contrast to the procedure described on the basis of FIGS. 6a-6c, this is not followed now by an integration of the IPS values established thus, but rather the IPS values of the individual light spots are plotted directly in a diagram (as illustrated in FIG. 7c).

An observation of the profile in this diagram as per FIG. 7c shows a linear decrease in the IPS value with an increasing "projection" of the component 711 of the polarization-influencing optical arrangement for the mirror elements of column 21 of the mirror arrangement 700, whereas there is a corresponding linear increase in the IPS value for the mirror elements of column 20 (which is covered by the component 711 of the polarization-influencing optical arrangement) of the mirror arrangement 700.

According to the invention, the angle by which the component of the polarization-influencing optical arrangement is rotated (in respect of the degree of freedom Rz) is now calculated from the gradient of the straight line shown in the diagram of FIG. 7c. Here, in the case where the width of the individual mirror elements is known, the angle about which the component 711 of the polarization-influencing optical arrangement is rotated about the z-axis is calculated from the gradient of the straight line. For the corresponding rotation about the z-axis, Rz=arc tan(m) applies, where m denotes the gradient of the straight line.

Hence, according to FIGS. 7b-7c, it is already possible to establish, from respectively one single IPS measurement for the light spots in the pupil plane, respectively generated by the mirror elements in columns 20, 21 of the mirror arrangement 700, the required rotational angle about which the component 711 of the polarization-influencing optical arrangement must be rotated about the z-axis in order finally to position the component 711 exactly parallel to the transition region between columns 20, 21 of the mirror arrangement 700. FIGS. 8a-8b shows a comparison of the IPS distributions obtained for the situation prior to (FIG. 8a) and the situation after (FIG. 8b) the above-described adjustment.

Even though the invention has been described on the basis of specific embodiments, numerous variations and alternative embodiments are apparent to the person skilled in the art, e.g. through combination and/or exchange of features of individual embodiments. Accordingly, it goes without saying for the person skilled in the art that such variations and alternative embodiments are concomitantly encompassed by the present invention, and the scope of the invention is restricted only within the meaning of the accompanying patent claims and the equivalents thereof.

The invention claimed is:

1. A method of adjusting an optical system in a microlithographic projection exposure apparatus, wherein:
   the optical system comprises:
      a mirror arrangement comprising a plurality of mirror elements which are adjustable independently from one another to change an angular distribution of light reflected by the mirror arrangement; and
      a polarization-influencing optical arrangement comprising a polarization-influencing component configured so that displacing the polarization-influencing component varies a degree of overlap between the polarization-influencing component and the mirror arrangement; and
   the method comprises:
      a) establishing, for a given actual position of the polarization-influencing component, a distribution of IPS values in a pupil plane of the projection exposure apparatus, each IPS value denoting a degree of realization of a predetermined polarization state for a light ray reflected at a respective mirror element of the mirror arrangement; and
      b) changing the position of the polarization-influencing component based on the distribution established in a).

2. The method of claim 1, wherein mirror elements whose distance from an edge of the polarization-influencing component exceeds a predetermined threshold are not considered when establishing the distribution in a).

3. The method of claim 2, wherein light reflected at the mirror elements that are not considered when establishing the distribution in a) is deflected into a separate region in the pupil plane or toward a beam trap.

4. The method of claim 2, wherein the predetermined threshold corresponds to at least a width of one mirror element of the mirror arrangement.

5. The method of claim 2, wherein the predetermined threshold corresponds to at least double a width of a mirror element of the mirror arrangement.

6. The method of claim 2, wherein the predetermined threshold corresponds to at least triple a width of a mirror element of the mirror arrangement.

7. The method of claim 1, wherein mirror elements whose degree of overlap with the polarization-influencing component is 100% are not considered in the distribution in a).

8. The method of claim 1, wherein mirror elements whose degree of overlap with the polarization-influencing optical element is zero are not considered in the distribution in a).

9. The method of claim 1, further comprising using a polarization-measuring instrument during the determination in a), wherein the polarization-measuring instrument is in a reticle plane of the projection exposure apparatus.

10. The method of claim 1, further comprising using an array of polarization-measuring instruments during the determination in a), wherein the array of polarization-measuring instruments is in a reticle plane of the projection exposure apparatus.

11. The method of claim 1, wherein b) comprises changing the position of the polarization-influencing component so that an edge of the polarization-influencing component projected on the mirror arrangement is between two adjacent rows or columns of mirror elements.

12. The method of claim 1, further comprising repeatedly performing a) and b) to approximate an intended position of the polarization-influencing component.

13. The method of claim 1, wherein the polarization-influencing component comprises a lambda/2 plate.

14. The method of claim 1, wherein the polarization-influencing component comprises optically active material.

15. The method of claim 1, wherein the polarization-influencing component comprises crystalline quartz with an optical crystal axis parallel to a light-propagation direction.

16. A method, comprising:
  a) establishing, for a given actual position of a polarization-influencing component of a polarization-influencing optical arrangement of an optical system of a microlithographic projection exposure apparatus, a distribution of IPS values in a pupil plane of the projection exposure apparatus, each IPS value denoting a degree of realization of a predetermined polarization state for a light ray reflected at a respective mirror element of a mirror arrangement of the projection exposure apparatus, the mirror arrangement comprising a plurality of independently adjustable mirror elements; and
  b) changing a position of the polarization-influencing component on the basis of the distribution established in a), wherein displacing the polarization-influencing optical component varies a degree of over-lap between the polarization-influencing component and the mirror arrangement.

17. A method of adjusting an optical system in a microlithographic projection exposure apparatus, wherein:
  the optical system comprises:
    a mirror arrangement comprising a plurality of mirror elements which are adjustable independently from one another to change an angular distribution of light reflected by the mirror arrangement; and
    a polarization-influencing optical arrangement comprising a polarization-influencing component configured so that displacing the polarization-influencing element varies a degree of overlap between the polarization-influencing component and the mirror arrangement; and
  the method comprises:
    a) placing an edge of the polarization-influencing component into a beam path of the optical system;
    b) performing an IPS measurement for light incident on the pupil plane after reflection on mirror elements of the mirror arrangement; and
    c) establishing a positional change of the polarization-influencing component required for generating a desired polarization distribution on the basis of the IPS measurement carried out in b).

18. The method of claim 17, wherein mirror elements whose distance from the edge exceeds a predetermined threshold are not concerned when performing the IPS measurement in b).

19. The method of claim 18, wherein light reflected at the mirror elements mirror elements whose distance from the edge exceeds a predetermined threshold is deflected into a separate region in the pupil plane or toward a beam trap.

20. The method of claim 17, wherein mirror elements whose degree of overlap with the polarization-influencing component is 100% are not considered when performing the IPS measurement in b).

21. The method of claim 17, wherein mirror elements whose degree of overlap with the polarization-influencing component is zero are not considered when performing the IPS measurement in b).

* * * * *